(12) United States Patent
Yin et al.

(10) Patent No.: US 12,279,062 B2
(45) Date of Patent: Apr. 15, 2025

(54) IMAGE SENSOR AND OPERATION METHOD THEREOF

(71) Applicant: Guangzhou Tyrafos Semiconductor Technologies Co., LTD, Guangzhou (CN)

(72) Inventors: Ping-Hung Yin, Taipei (TW);
Jia-Shyang Wang, Miaoli (TW);
Jia-Sian Lyu, Pingtung (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 141 days.

(21) Appl. No.: 18/304,323

(22) Filed: Apr. 20, 2023

(65) Prior Publication Data

US 2023/0370751 A1 Nov. 16, 2023

Related U.S. Application Data

(60) Provisional application No. 63/341,423, filed on May 13, 2022.

(51) Int. Cl.
*H04N 25/78* (2023.01)
*G06F 1/08* (2006.01)
(Continued)

(52) U.S. Cl.
CPC ............. *H04N 25/78* (2023.01); *G06F 1/08* (2013.01); *H01L 25/0753* (2013.01); *H01L 25/18* (2013.01); *H03K 19/018521* (2013.01); *H03L 7/099* (2013.01); *H04N 25/60* (2023.01); *H04N 25/627* (2023.01); *H04N 25/63* (2023.01); *H04N 25/709* (2023.01); *H04N 25/77* (2023.01);
(Continued)

(58) Field of Classification Search
CPC ...... H04N 25/78; H04N 25/60; H04N 25/627; H04N 25/63; H04N 25/709; H04N 25/77; H04N 25/772; H04N 25/778; H04N 25/7795; H04N 25/779; G06F 1/08; H01L 25/0753; H01L 25/18; H01L 27/14612; H01L 27/14632; H01L 27/14636; H03K 19/018521; H03K 5/01; H03L 7/099; H03L 7/0992
See application file for complete search history.

(56) References Cited

U.S. PATENT DOCUMENTS

2015/0009379 A1* 1/2015 Yan ...................... H04N 25/772
257/225
2015/0123173 A1 5/2015 He
(Continued)

OTHER PUBLICATIONS

"Office Action of Taiwan Counterpart Application", issued on Sep. 26, 2023, p. 1-p. 8.

*Primary Examiner* — Shahbaz Nazrul
(74) *Attorney, Agent, or Firm* — JCIPRNET (57) ABSTRACT

An image sensor and an operation method thereof are provided. The image sensor includes a pixel circuit and a column readout circuit. The pixel circuit includes a pixel unit, a transfer transistor, a reset transistor, a readout transistor and a selection transistor. The column readout circuit includes a first circuit node and a second circuit node. A first terminal of the first reset transistor and a first terminal of the first readout transistor are coupled to a first circuit node, and a second terminal of the first select transistor is coupled to a second circuit node.

17 Claims, 7 Drawing Sheets

(51) Int. Cl.

| | |
|---|---|
| *H01L 25/075* | (2006.01) |
| *H01L 25/18* | (2023.01) |
| *H03K 19/0185* | (2006.01) |
| *H03L 7/099* | (2006.01) |
| *H04N 25/60* | (2023.01) |
| *H04N 25/627* | (2023.01) |
| *H04N 25/63* | (2023.01) |
| *H04N 25/709* | (2023.01) |
| *H04N 25/76* | (2023.01) |
| *H04N 25/77* | (2023.01) |
| *H04N 25/772* | (2023.01) |
| *H04N 25/778* | (2023.01) |
| *H10F 39/00* | (2025.01) |

(52) U.S. Cl.
CPC ......... *H04N 25/772* (2023.01); *H04N 25/778* (2023.01); *H04N 25/7795* (2023.01); *H10F 39/026* (2025.01); *H10F 39/8037* (2025.01); *H10F 39/811* (2025.01)

(56) References Cited

U.S. PATENT DOCUMENTS

| | | | |
|---|---|---|---|
| 2018/0352183 A1* | 12/2018 | Yin | H04N 25/70 |
| 2021/0185251 A1* | 6/2021 | Yonemoto | H04N 25/587 |
| 2023/0247325 A1* | 8/2023 | Zha | H04N 25/77 |
| | | | 250/206 |

* cited by examiner

IMAGE SENSOR AND OPERATION METHOD THEREOF

CROSS-REFERENCE TO RELATED APPLICATION

This application claims the priority benefit of the U.S. provisional application Ser. No. 63/341,423, filed on May 13, 2022. The entirety of the above-mentioned patent application is hereby incorporated by reference herein and made a part of this specification.

BACKGROUND

Technical Field

The disclosure relates to a sensor, and particularly relates to an image sensor and an operation method thereof.

Description of Related Art

Generally, a plurality of bias signal lines and a plurality of reset signal lines must be provided in a conventional image sensor to respectively provide bias voltages and reset voltages. Moreover, from a point of view of a manufacturing process, a plurality of metal wires of the plurality of bias signal lines and the plurality of reset signal lines will span across a pixel array of the image sensor, which leads to a decrease in a fill factor of the image sensor and poor Gb/Gr balance.

SUMMARY

The disclosure is directed to an image sensor and an operation method thereof, where the image sensor has a higher fill factor and has a good Gb/Gr balance effect.

The disclosure provides an image sensor including a first pixel circuit and a column readout circuit. The first pixel circuit includes a first pixel unit, a first transfer transistor, a first reset transistor, a first readout transistor and a first selection transistor. A first terminal of the first transfer transistor is coupled to a first floating diffusion node. A second terminal of the first transfer transistor is coupled to the first pixel unit. The first reset transistor is coupled to the first floating diffusion node. A control terminal of the first readout transistor is coupled to the first floating diffusion node. A first terminal of the first selection transistor is coupled to the first readout transistor.

The disclosure provides an operation method of an image sensor. The image sensor includes a first pixel circuit and a column readout circuit. The first pixel circuit includes a first pixel unit, a first transfer transistor, a first reset transistor, a first readout transistor and a first selection transistor. The column readout circuit includes a first circuit node and a second circuit node. A first terminal of the first reset transistor and a first terminal of the first readout transistor are coupled to the first circuit node. The first selection transistor is coupled to the second circuit node. The operation method includes following steps: during a reset period, a first reset signal is received through a control terminal of the first reset transistor, so as to reset the first floating diffusion node through a first voltage of the first circuit node and a control terminal of the first transfer transistor receives a first transfer signal so that a first sampling node (the first pixel unit) is reset together. During an exposure period, charges provided by the first pixel unit are accumulated through the first sampling node. During a readout period, the control terminal of the first transfer transistor receives the first transfer signal, so that the charges accumulated at the first sampling node are transferred to the first floating diffusion node, a first selection signal is received through a control terminal of the first selection transistor, so that the first readout transistor amplifies a charge signal accumulated at the first floating diffusion node and transmits it to the first circuit node, and the column readout circuit reads out the charge signal, where the first selection transistor generates a bias current flowing through the column readout circuit, so that the first readout transistor operates in a normal operating range.

Based on the above description, in the image sensor and the operation method thereof of the disclosure, by integrating a signal line used for providing the reset voltage and a signal line used for providing the bias voltage (i.e. transmission signal line for reading sensing signal of the disclosure) into usage of a same circuit node and a same signal line of the column readout circuit, at least the metal wire for providing the reset voltage is saved, so that the image sensor has a good fill factor, and better Gb/Gr balance effect.

To make the aforementioned more comprehensible, several embodiments accompanied with drawings are described in detail as follows.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
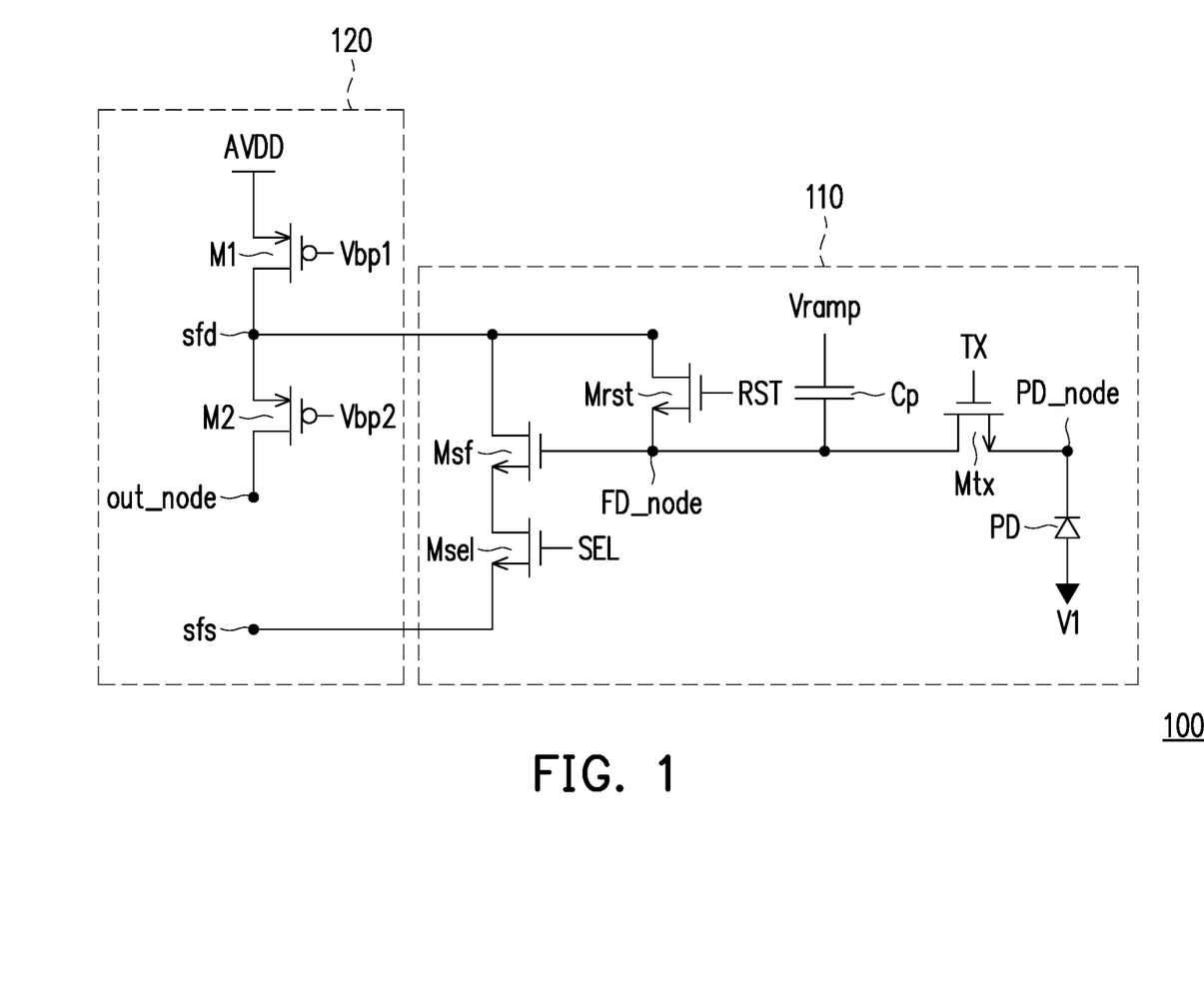
FIG. 1 is a schematic circuit diagram of an image sensor according to an embodiment of the disclosure.

FIG. 1 is a schematic circuit diagram of an image sensor according to an embodiment of the disclosure. Referring to FIG. 1, an image sensor 100 includes a pixel array and a readout circuit. The pixel array may include a plurality of pixel circuits. The readout circuit may include a plurality of column readout circuits. One pixel circuit and one column readout circuit will be described in detail below. In the embodiment, a pixel circuit 110 includes a column readout circuit 120. The pixel circuit 110 includes a pixel unit PD, a transfer transistor Mtx, a reset transistor Mrst, a readout transistor Msf, a selection transistor Msel, and a capacitor Cp. The transfer transistor Mtx, the reset transistor Mrst, the readout transistor Msf, and the selection transistor Msel may be N-type transistors (such as N-type-metal-oxide-semiconductor (NMOS)) respectively. In the embodiment, the column readout circuit 120 includes a first transistor M1 and a second transistor M2. The first transistor M1 and the second transistor M2 may be P-type transistors, respectively.

In the embodiment, the pixel unit PD may be a photodiode, and is coupled between a sampling node PD_node and a reference voltage V1 (for example, ground voltage). A first terminal of the transfer transistor Mtx is coupled to a floating diffusion node FD_node. A second terminal of the transfer transistor Mtx is coupled to the pixel unit PD. A control terminal of the transmit transistor Mtx receives a transfer signal TX. A first terminal of the reset transistor Mrst is coupled to a first circuit node sfd of the column readout circuit 120. A second terminal of the reset transistor Mrst is coupled to the floating diffusion node FD_node. A control terminal of the reset transistor Mrst receives a reset signal RST. A first terminal of the readout transistor Msf is coupled to the first circuit node sfd of the column readout circuit 120. A second terminal of the readout transistor Msf is coupled to a first terminal of the selection transistor Msel. A control terminal of the readout transistor Msf is coupled to the floating diffusion node FD_node. The first terminal of the selection transistor Msel is coupled to the second terminal of the readout transistor Msf. A second terminal of the selection transistor Msel is coupled to a second circuit node sfs. A control terminal of the selection transistor Msel receives a selection signal SEL. One terminal of the capacitor Cp receives a ramp signal Vramp, and the other terminal of the capacitor Cp is coupled to the floating diffusion node FD_node. The capacitor Cp is coupled between the ramp signal Vramp and the floating diffusion node FD_node. In the embodiment, the ramp signal Vramp may be an up-ramp signal or a down-ramp signal.

In the embodiment, a first terminal of the first transistor M1 is coupled to an operating voltage AVDD. A second terminal of the first transistor M1 is coupled to the first circuit node sfd. A control terminal of the first transistor M1 may receive a first control voltage Vbp1. A first terminal of the second transistor M2 is coupled to the first circuit node sfd. A second terminal of the second transistor M2 is coupled to an output node out_node. A control terminal of the second transistor M2 may receive a second control voltage Vbp2. In the embodiment, the first circuit node sfd and the output node out_node may be respectively and selectively applied with a voltage level of a DC node thereof and a voltage level of the reset voltage required by the first terminal of the reset transistor Mrst according to the first control voltage Vbp1 and the second control voltage Vbp2.

In the embodiment, the reset transistor Mrst and the readout transistor Msf are respectively coupled to the first circuit node sfd of the column readout circuit 120, so that the column readout circuit 120 may provide a reset voltage to the floating diffusion node FD_node through the first circuit node sfd to reset the voltage of the floating diffusion node FD_node. Moreover, the column readout circuit 120 may also provide a sensing signal amplification transmission path from the first terminal of the readout transistor Msf to the first terminal of the second transistor M2 through the first circuit node sfd, so that an operation mode of the readout transistor Msf is changed from a source follower to an amplifier input stage transistor (common source), so as to transmit a voltage change of the floating diffusion node FD_node to the first circuit node sfd of the column readout circuit 120 through the readout transistor Msf, where the selection transistor Msel is coupled to the second circuit node sfs, so that the column readout circuit 120 may provide a bias current, and the readout transistor Msf may operate in a normal operating range. From another point of view, since the selection transistor Msel is turned on, the selection transistor Msel may generate the bias current flowing through the column readout circuit 120, and the readout transistor Msf may operate in the normal operating range. A voltage provided by the first circuit node sfd is determined by controlling the first transistor M1 and the second transistor M2 by the first control voltage Vbp1 and the second control voltage Vbp2.

In the embodiment, since a readout sensing signal transmission path and the reset voltage required by the pixel circuit 110 are all provided by the first circuit node sfd, the readout sensing signal transmission path and the reset voltage required by the pixel circuit 110 may be obtained from the column readout circuit 120 through a same wire. In other words, the pixel array of the image sensor 100 may effectively save a plurality of metal wires (for example, respectively used for providing reset voltages of multiple columns or rows of pixel circuits) arranged in a vertical direction or a horizontal direction in an active area. In this way, the image sensor 100 of the embodiment may have a higher fill factor and a good Gb/Gr balance effect.

In the embodiment, the image sensor 100 may be a CMOS image sensor (CIS), and may be an active pixel sensor (APS). The image sensor 100 may be implemented by a back side illuminated (BSI) or front side illuminated (FSI) manufacturing process and package structure, and is applicable to small pitch pixels.

Figure 2:
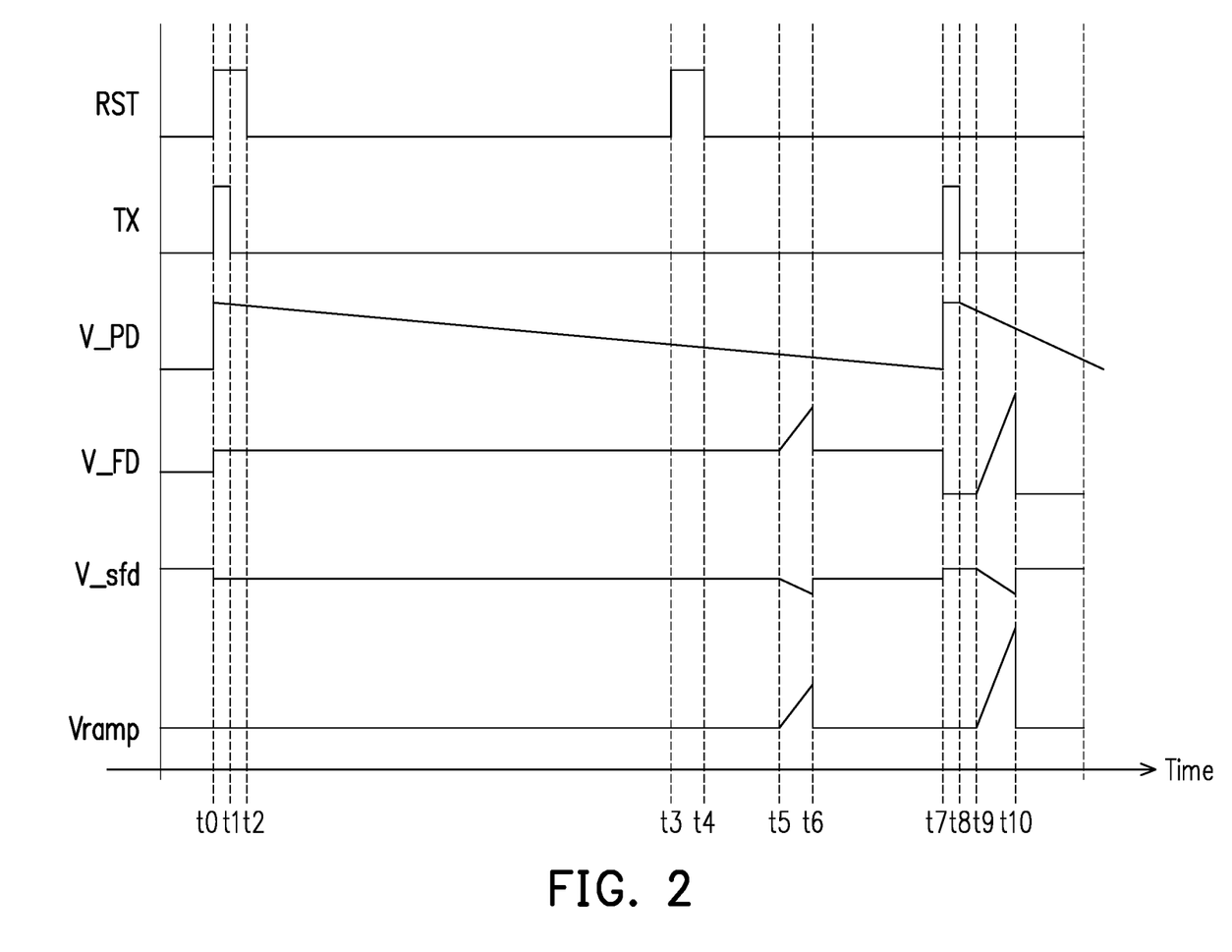
FIG. 2 is an operation timing diagram of the image sensor in the embodiment of FIG. 1.

FIG. 2 is an operation timing diagram of the image sensor in the embodiment of FIG. 1. Referring to FIG. 1 and FIG. 2, the image sensor 100 may operate in the operation timing shown in FIG. 2. During a period from a time t0 to a time t2, the reset signal RST is switched from a low voltage level to a high voltage level to turn on the reset transistor Mrst. During a period from the time t0 to a time t1, a voltage V_sfd of the first circuit node sfd is at a specific voltage level (i.e., a reset voltage level). Moreover, the transfer signal TX is switched from the low voltage level to the high voltage level to turn on the transfer transistor Mtx. In this way, a voltage V_FD of the floating diffusion node FD_node and a voltage V_PD of the sampling node PD_node may be respectively reset by the voltage V_sfd of the first circuit node sfd.

During a period from the time t2 to a time t3, the reset signal RST and the transfer signal TX are respectively switched to the low voltage level. During a period from the time t3 to a time t4, the reset signal RST is switched from the low voltage level to the high voltage level to turn on the reset transistor Mrst. The voltage V_FD of the floating diffusion node FD_node may be reset again. After a time t4, the reset signal RST and the transfer signal TX are respectively switched to the low voltage level. During a period from a time t5 to a time t6, a voltage of the ramp signal Vramp forms an up-ramp waveform, so that the voltage V_FD of the floating diffusion node FD_node forms an up-ramp waveform correspondingly, and the column readout circuit 120 may read out a background noise signal from the first circuit node sfd and the second circuit node sfs (when the selection transistor Msel is turned on according to the selection signal SEL). The voltage V_sfd of the first circuit node sfd may decrease accordingly to form a down-ramp waveform.

Then, during a period from a time t7 to a time t8, the transfer signal TX is switched to the high voltage level, so that the voltage V_PD of the sampling node PD_node may be read to the floating diffusion node FD_node. At this time, the voltage V_sfd of the first circuit node sfd is amplified according to the charge signal accumulated at the floating diffusion node FD_node. During a period from a time t9 to a time t10, the voltage of the ramp signal Vramp forms another up-ramp waveform, so that the voltage V_FD of the floating diffusion node FD_node forms another up-ramp waveform correspondingly, and the column readout circuit 120 may read out a sensing signal (when the selection transistor Msel is turned on according to the selection signal SEL) as the first terminal of the readout transistor Msf and the second terminal of the selection transistor Msel of the pixel circuit 110 are coupled to the first circuit node sfd and the second circuit node sfs. The voltage V_sfd of the first circuit node sfd may decrease accordingly to form a down-ramp waveform. Therefore, other computing circuits of the column readout circuit 120 may perform denoising processing on the sensing signal according to the background noise signal, so as to generate a sensing signal without the background noise (i.e., to obtain the sensing signal with higher signal-to-noise ratio (SNR)).

Figure 3:
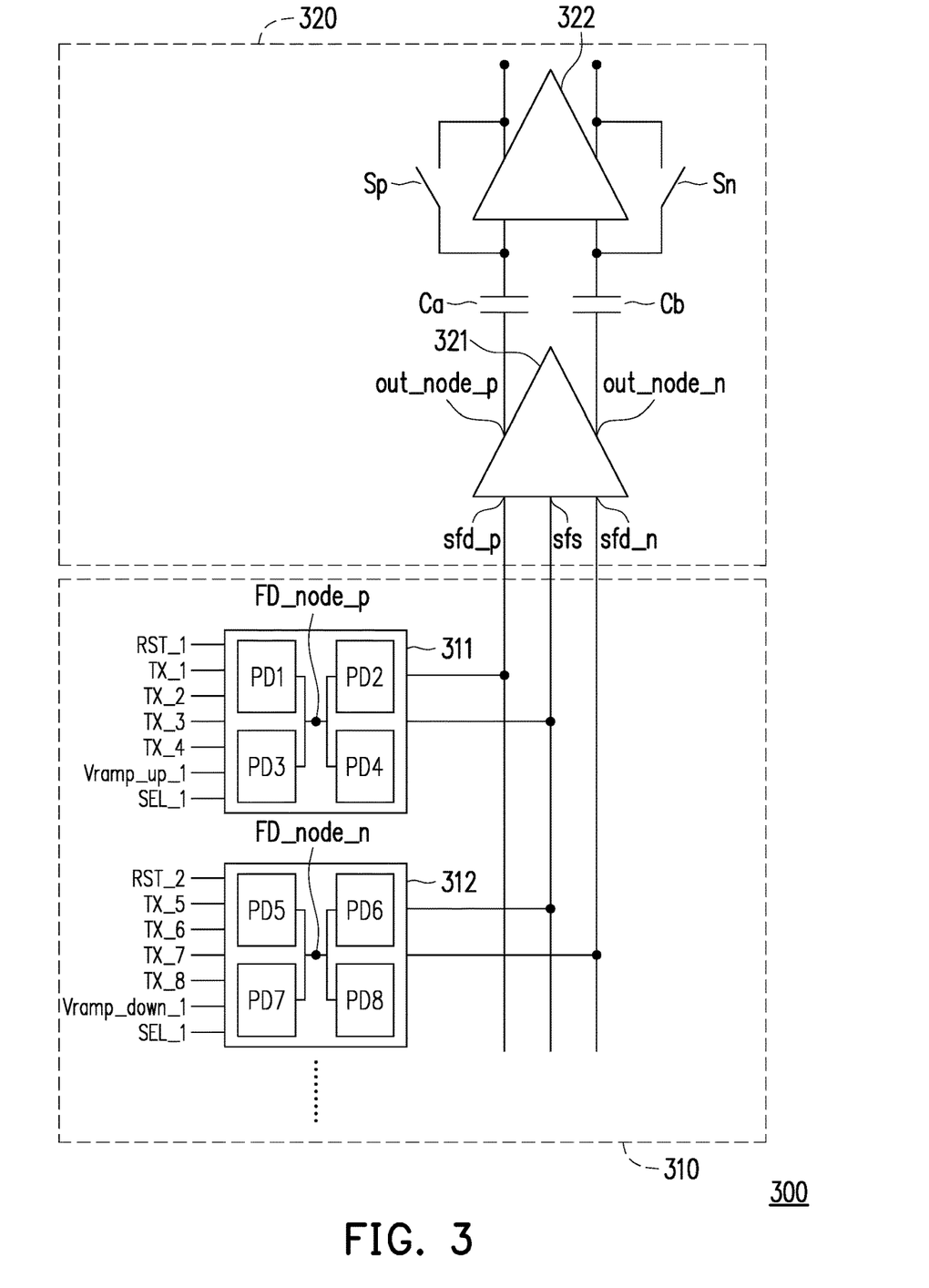
FIG. 3 is a schematic circuit diagram of an image sensor according to another embodiment of the disclosure.

FIG. 3 is a schematic circuit diagram of an image sensor according to another embodiment of the disclosure. Referring to FIG. 3, an image sensor 300 may be implemented as a correlated double sampling (CDS) circuit or a digital correlated double sampling (DDS) circuit. The image sensor 300 may include a pixel array 310 and a column readout circuit 320. In the embodiment, the pixel array 310 includes a plurality of pixel circuits. In the embodiment, the column readout circuit 320 may be coupled to a plurality of pixel circuits of a certain column in the pixel array 310. Each column of the pixel array may respectively include a combination of a plurality of pixel circuits 311 and a plurality of pixel circuits 312. The column readout circuit 320 may include a plurality of first stage amplifiers and a plurality of second stage amplifiers, and the first stage amplifiers are respectively coupled to the second stage amplifiers.

It should be noted that in the following description, the pixel circuit 311 and the pixel circuit 312 are taken as an example for description. In the embodiment, the pixel circuit 311 and the pixel circuit 312 respectively include four pixel units and four transfer transistors, where the four pixel units are respectively coupled to a floating diffusion node FD_node_n and a floating diffusion node FD_node_p through the four transfer transistors. The column readout circuit 320 includes a first stage amplifier 321, a second stage amplifier 322, a capacitor Ca, a capacitor Cb, a switch Sp, and a switch Sn, and the first stage amplifier 321, the second stage amplifier 322, the pixel circuit 311, and the pixel circuit 312 form a differential output.

In the embodiment, the pixel circuit 311 includes a plurality of pixel units PD1-PD4, and the pixel circuit 312 includes a plurality of pixel units PD5-PD8. The pixel units PD1-PD4 may be coupled to the same floating diffusion node FD_node_p in the pixel circuit 311. The pixel units PD5-PD8 may be coupled to the same floating diffusion node FD_node_n in the pixel circuit 312. In the embodiment, the first stage amplifier 321 includes a first input terminal, a second input terminal and a third input terminal. The first input terminal of the first stage amplifier 321 is coupled to the first circuit node sfd_p. The second input terminal of the first stage amplifier 321 is coupled to the other first circuit node sfd_n. The third input terminal of the first stage amplifier 321 is coupled to the second circuit node sfs. The first stage amplifier 321 also includes a first output terminal and a second output terminal. The first output terminal of the first stage amplifier 321 is coupled to a first output node out_node_p. The second output terminal of the first stage amplifier 321 is coupled to a second output node out_node_n.

In the embodiment, the second stage amplifier 322 includes a first input terminal, a second input terminal, a first output terminal and a second output terminal. The first output terminal of the first stage amplifier 321 is coupled to the first input terminal of the second stage amplifier 322 through the capacitor Ca. The second output terminal of the first stage amplifier 321 is coupled to the second input terminal of the second stage amplifier 322 through the capacitor Cb. The switch Sp is coupled between the first input terminal and the first output terminal of the second stage amplifier 322. The switch Sn is coupled between the second input terminal and the second output terminal of the second stage amplifier 322.

In the embodiment, the pixel circuit 311 may receive a reset signal RST_1, transfer signals TX_1-TX_4, a ramp signal Vramp_up_1 and a selection signal SEL_1. The pixel circuit 312 may receive a reset signal RST_2, transfer signals TX_5-TX_8, a ramp signal Vramp_down_1 and the selection signal SEL_1. The selection signal SEL_1 may be used to select reading out the sensing results of the pixel units PD1-PD8 in the pixel circuits 311 and 312 at the same time. In this regard, the transfer signals TX_1-TX_4 may be used to respectively determine whether to read out the sensing signals of the pixel units PD1-PD4 to the floating diffusion node FD_node_p, and sequentially read out the sensing signals of the pixel units PD1-PD4 to the first circuit node sfd_p in collaboration with the ramp signal Vramp_up_1. The transfer signals TX_5-TX_8 may be used to respectively determine whether to read out the sensing signals of the pixel units PD5-PD8 to the floating diffusion node FD_node_n, and sequentially read out the sensing signals of the pixel units PD5-PD8 to the other first circuit node sfd_n in collaboration with the ramp signal Vramp_down_1. In the embodiment, the ramp signal Vramp_up_1 may be an up-ramp signal during a period of reading the pixel circuit 311, and may be a down-ramp signal during a period of reading the pixel circuit 312, and the ramp signal Vramp_down_1 may be a down-ramp signal during the period of reading the pixel circuit 311, and may be an up-ramp signal during the period of reading the pixel circuit 312.

In the embodiment, the first stage amplifier 321 may perform first signal amplification on the sensing signal and differentially output it to the second stage amplifier 322, and then the second stage amplifier 322 outputs the sensing result to post-end other processing circuits. It should be noted that the analog-to-digital converter (ADC) including the first-stage amplifier 321 and the second-stage amplifier 322, etc., uses a differential scheme. Therefore, when a sensing signal provided by the sensing unit is subjected to analog-to-digital conversion, the pixel circuit of an adjacent row needs to be used as a reference to implement the analog-to-digital conversion. The floating diffusion node FD_node in the pixel circuit used as the reference is only reset by the reset transistor Mrst to obtain a reset charge. To be specific, the pixel circuit 311 includes the pixel units PD1-PD4 and the pixel circuit 312 includes the pixel units PD5-PD8 to read out sequentially, when the sensing signal provided by the pixel unit PD1 is transmitted to the floating diffusion node FD_node_p through the transfer transistor Mtx1, it is required to cooperate with the floating diffusion node FD_node_n in the pixel circuit 312 to perform the digital-to-analog conversion, and the floating diffusion node FD_node_n is only reset by the reset transistor Mrst_n to obtain a reset charge. By using the differential scheme, better signal-to-noise ratio (SNR), power supply rejection ratio (PSRR), pixel and circuit offset cancellation, etc., may be achieved.

Figure 4:
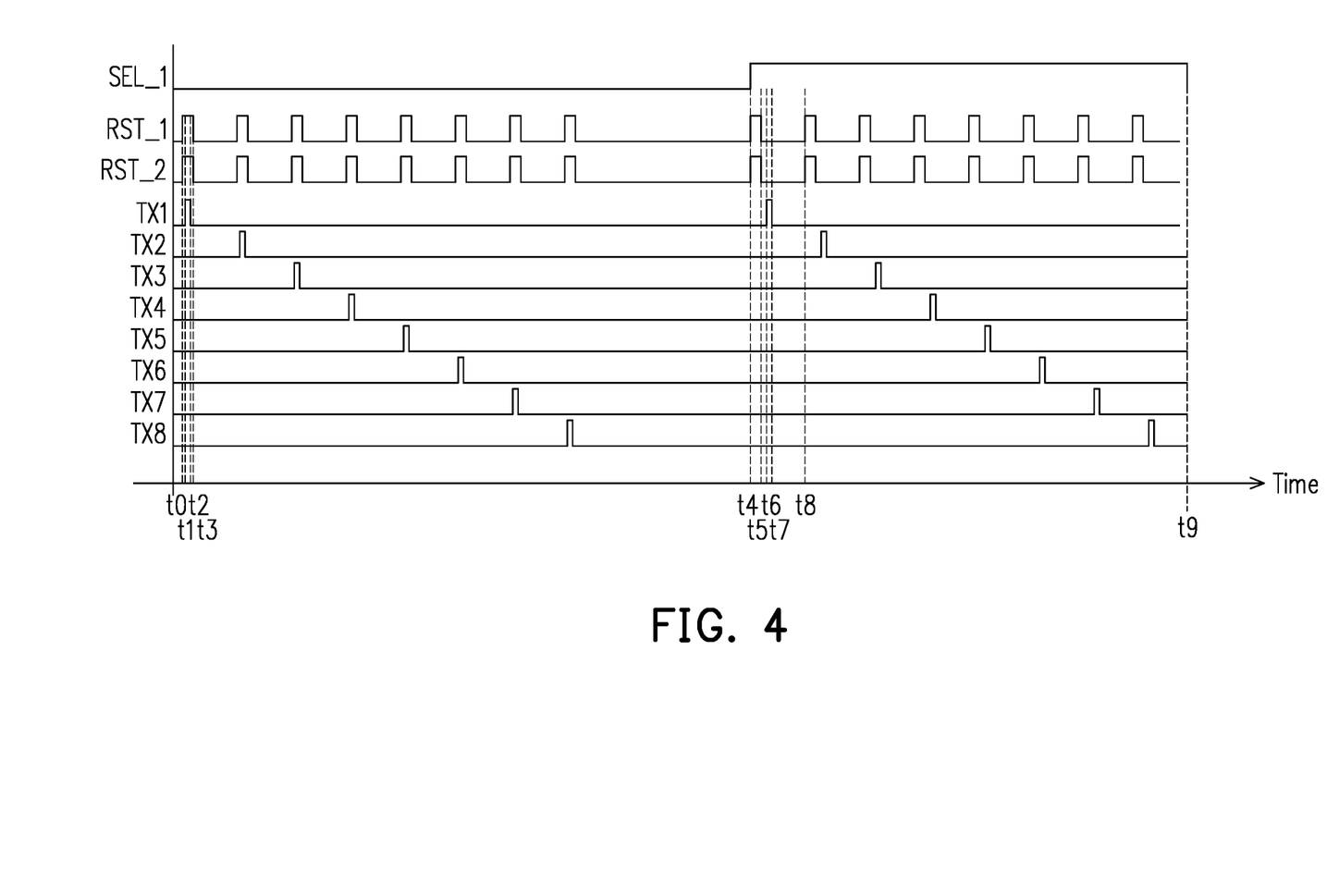
FIG. 4 is an operation timing diagram of the image sensor of the embodiment of FIG. 3.

FIG. 4 is an operation timing diagram of the image sensor of the embodiment of FIG. 3. Referring to FIG. 3 and FIG. 4, the image sensor 300 may operate in the operation timing shown in FIG. 4. During a period from a time t0 to a time t4, the selection signal SEL_1 may be at the low voltage level, so that the column readout circuit 320 cannot obtain relevant voltage signals of the floating diffusion node FD_node_p and the floating diffusion node FD_node_n in the pixel circuit 311 and the pixel circuit 312. The period from the time t0 to the time t4 may be a reset period and an exposure period. During a period from the time t4 to a time t9, the selection signal SEL_1 may be at the high voltage level, so that the voltages of the floating diffusion nodes FD_node_p and the floating diffusion nodes FD_node_n of the pixel circuit 311 and the pixel circuit 312 are sequentially output. The period from the time t4 to the time t9 may be a readout period.

To be specific, during the period from the time t0 to a time t3, the reset signal RST_1 and the reset signal RST_2 may be switched to the high voltage level, so as to reset the voltages of the floating diffusion node FD_node_p and the floating diffusion node FD_node_n of the pixel circuit 311 and the pixel circuit 312. Moreover, during a period from a time t1 to a time t2, the transfer signal TX_1 may be at the high voltage level, so that a voltage level of the pixel unit PD1 may be reset (the same as the reset method described in the embodiment of FIG. 2). Deduced by analogy, the reset signal RST_1 and the reset signal RST_2 may be switched to the high voltage level periodically. Moreover, during the period when the reset signal RST_1 and the reset signal RST_2 are at the high voltage level, the transfer signals TX_1-TX_8 may be sequentially switched to the high voltage level, so as to sequentially reset the voltage levels of the pixel units PD1-PD8.

During a period from the time t4 to a time t5, the reset signal RST_1 and the reset signal RST_2 may be switched to the high voltage level, so as to reset the voltages of the floating diffusion node FD_node_p and the floating diffusion node FD_node_n of the pixel circuit 311 and the pixel circuit 312. Moreover, during a period from the time t6 to a time t7, the transfer signal TX_1 may be at the high voltage level, so that sensing charges accumulated in the pixel unit PD1 may be transmitted to the floating diffusion node FD_node_p. During a period from the time t7 to the time t8, the first stage amplifier 321 cooperates with a readout transistor Msf_p and a selection transistor Msel_p in the pixel circuit 311 and a readout transistor Msf_n and a selection transistor Msel_n in the pixel circuit 312 to perform first signal amplification on the voltage signals of the floating diffusion node FD_node_p and the floating diffusion node FD_node_n, where the floating diffusion node FD_node_n is only reset by the reset transistor Mrst_n in the pixel circuit 312 to obtain a reset charge, and the amplified sensing signal is provided to the second stage amplifier 322 through the output terminals out_node_p and out_node_n of the first stage amplifier 321, so that the second stage amplifier 322 outputs the corresponding sensing signal to post-end other processing circuits. Deduced by analogy, the reset signal RST_1 and the reset signal RST_2 may be switched to the high voltage level periodically. Moreover, after the period that the reset signal RST_1 and the reset signal RST_2 are at the high voltage level, the transfer signals TX_1-TX_8 may be sequentially switched to the high voltage level, so as to sequentially read out the sensing results of the pixel units PD1-PD8 to the column readout circuit 320.

In the embodiment, the pixel circuit 311 and the pixel circuit 312 form a pixel group, and the pixel array of the image sensor 300 may include multiple pixel groups, where these pixel groups may receive different selection signals, so that the column readout circuit 320 may sequentially read out the sensing results of different pixel groups.

Figure 5:
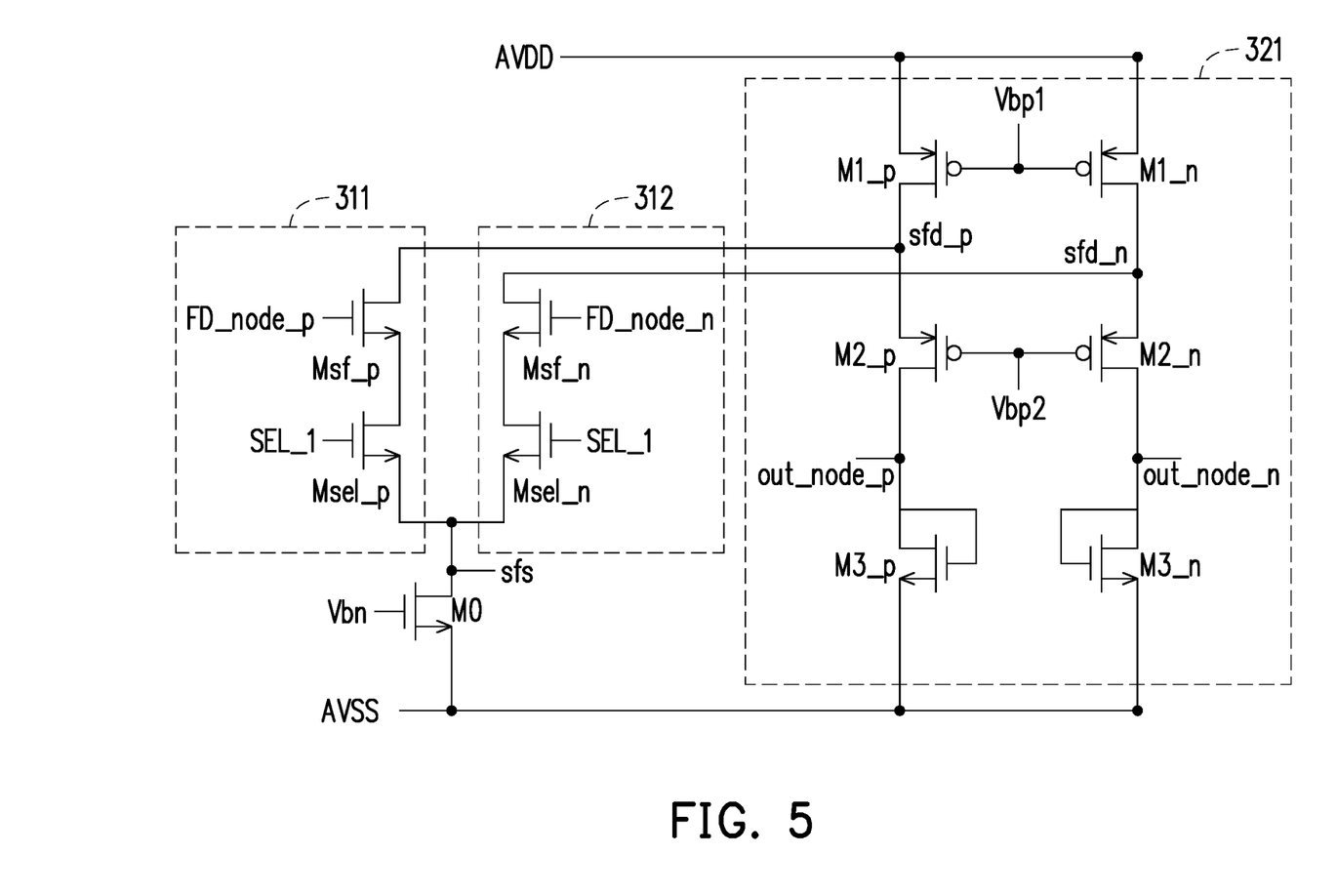
FIG. 5 is a schematic circuit diagram of an image sensor according to another embodiment of the disclosure.

FIG. 5 is a schematic circuit diagram of an image sensor according to another embodiment of the disclosure. Referring to FIG. 5, partial circuit scheme of the image sensor 300 in FIG. 3 may be used to implement the circuit scheme shown in FIG. 5. In the embodiment, the pixel circuit 311 may include the readout transistor Msf_p and the selection transistor Msel_p. The pixel circuit 312 may include the readout transistor Msf_n and the selection transistor Msel_n. The first stage amplifier 321 may include a first transistor M1_p, a second transistor M2_p, a third transistor M1_n, a fourth transistor M2_n, a fifth transistor M3_p, and a sixth transistor M3_n. In the embodiment, a first terminal of the readout transistor Msf_p is coupled to the first circuit node sfd_p (i.e., the first input terminal) of the first stage amplifier 321. A second terminal of the selection transistor Msel_p is coupled to the second circuit node sfs (i.e., the third input terminal) and a first terminal of a bias transistor M0. A control terminal of the readout transistor Msf_p is coupled to the floating diffusion node FD_node_p of the pixel circuit 311 for reading a voltage of the floating diffusion node FD_node_p (i.e., a sensing result of the pixel unit in the pixel circuit 311). A first terminal of the readout transistor Msf_n is coupled to another first circuit node sfd_n (i.e., the second input terminal) of the first stage amplifier 321. A second terminal of the selection transistor Msel_n is coupled to the second circuit node sfs and the first terminal of the bias transistor M0. A control terminal of the readout transistor Msf_n is coupled to the floating diffusion node FD_node_n of the pixel circuit 312 for reading a voltage of the floating diffusion node FD_node_n (i.e., a sensing result of the pixel unit in the pixel circuit 312). A second terminal of the bias transistor M0 is coupled to an operating voltage AVSS. A control terminal of the bias transistor M0 receives a bias voltage Vbn, so that the bias transistor M0 operates as a current source, and during a readout period, the operation of the bias transistor M0 may be regarded as that the pixel circuit 311 and the pixel circuit 312 share the same current source. In particular, the readout transistor Msf_p of the pixel circuit 311 and the readout transistor Msf_n of the pixel circuit 312 may be regarded as input differential pair transistors of a differential amplifier, and two input terminals thereof are respectively coupled to the floating diffusion node FD_node_p and the floating diffusion node FD_node_n. In the embodiment, the readout transistor Msf_p, the selection transistor Msel_p, the readout transistor Msf_n, the selection transistor Msel_n, and the bias transistor M0 may be N-type transistors, respectively.

In the embodiment, a first terminal of the first transistor M1_p is coupled to the operating voltage AVDD. The operating voltage AVDD may be higher than the operating voltage AVSS. A second terminal of the first transistor M1_p is coupled to a first terminal of the second transistor M2_p. A control terminal of the first transistor M1_p is coupled to a control terminal of the third transistor M1_n, and receives the first control voltage Vbp1. A second terminal of the second transistor M2_p is coupled to the first output terminal out_node_p and a first terminal of the fifth transistor M3_p. A control terminal of the second transistor M2_p is coupled to a control terminal of the fourth transistor M2_n, and receives the second control voltage Vbp2. In the embodiment, a first terminal of the third transistor M1_n is coupled to the operating voltage AVDD. A second terminal of the third transistor M1_n is coupled to a first terminal of the fourth transistor M2_n. The control terminal of the third transistor M1_n is coupled to the control terminal of the first transistor M1_p, and receives the first control voltage Vbp1. A second terminal of the fourth transistor M2_n is coupled to the second output terminal out_node_n and a first terminal of the sixth transistor M3_n. The control terminal of the fourth transistor M2_n is coupled to the control terminal of the second transistor M2_p, and receives the second control voltage Vbp2. In the embodiment, the first transistor M1_p, the second transistor M2_p, the third transistor M1_n and the fourth transistor M2_n may be P-type transistors respectively, and the fifth transistor M3_p and the sixth transistor M3_n may be N-type transistors, respectively. In the embodiment, actually, the first stage amplifier 321 is composed of the pixel circuit 311, the pixel circuit 312, the first transistor M1_p, the second transistor M2_p, the third transistor M1_n, the fourth transistor M2_n, the fifth transistor M3_p and the sixth transistor M3_n.

In the embodiment, a control terminal of the fifth transistor M3_p is coupled to the first terminal of the fifth transistor M3_p. A second terminal of the fifth transistor M3_p is coupled to the operating voltage AVSS. A control terminal of the sixth transistor M3_n is coupled to the first terminal of the sixth transistor M3_n. A second terminal of the sixth transistor M3_n is coupled to the operating voltage AVSS.

In the embodiment, other specific circuit elements of the pixel circuit 311 and the pixel circuit 312 may be deduced by referring to the relevant circuit elements of the pixel circuit 110 shown in FIG. 1. In an embodiment, the operating voltage AVSS may be, for example, a ground voltage. In this way, the reset voltage provided to the pixel circuit 311 by the first circuit node sfd_p may be equal to, for example, a voltage difference (|Vsg|) between the first terminal (source) and the control terminal (gate) of the second transistor M2_p plus the voltage of the second control voltage Vbp2. The reset voltage provided to the pixel circuit 312 by the other first circuit node sfd_n may be, for example, equal to a voltage difference (|Vsg|) between the first terminal (source) and the control terminal (gate) of the fourth transistor M2_n plus the voltage of the second control voltage Vbp2. It should be noted that the reset voltage in each embodiment of the disclosure is not implemented by an additional signal line by receiving the operating voltage AVDD, but is provided by the column readout circuit 321.

Figure 6:
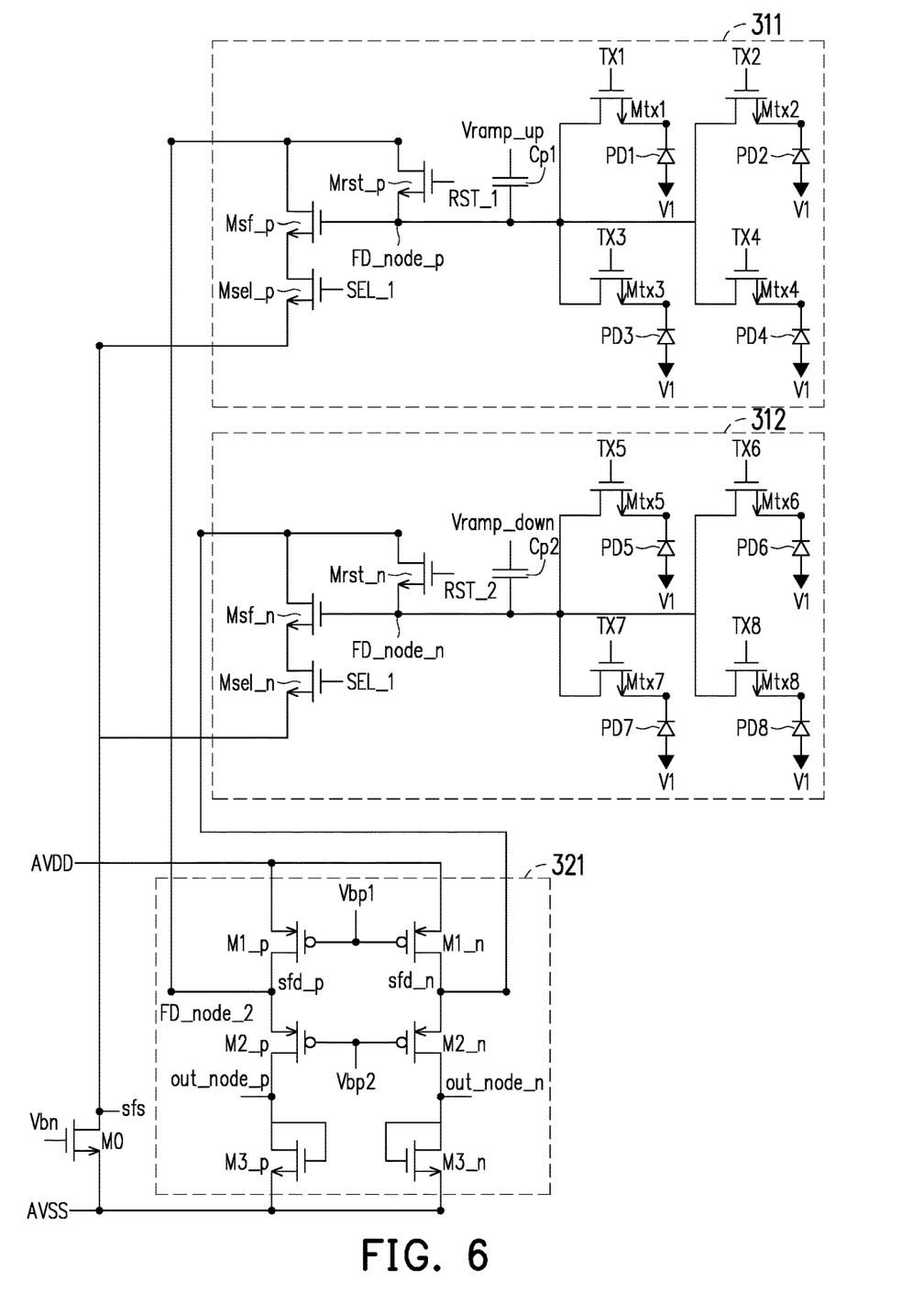
FIG. 6 is a schematic circuit diagram of an image sensor according to another embodiment of the disclosure.

FIG. 6 is a schematic circuit diagram of an image sensor according to another embodiment of the disclosure. Referring to FIG. 6, partial circuit scheme of the image sensor 300 in FIG. 6 may be implement as the circuit scheme shown in FIG. 5. In the embodiment, the pixel circuit 311 may include a readout transistor Msf_p, a selection transistor Msel_p, a reset transistor Mrst_p, transfer transistors Mtx_1-Mtx_4, pixel units PD1-PD4, and a capacitor Cp1. The readout transistor Msf_p, the selection transistor Msel_p, the reset transistor Mrst_p, and the transfer transistors Mtx_1-Mtx_4 may be N-type transistors respectively. The pixel circuit 312 may include a readout transistor Msf_n, a selection transistor Msel_n, a reset transistor Mrst_n, transfer transistors Mtx_5-Mtx_8, pixel units PD5-PD8, and a capacitor Cp2. The first stage amplifier 321 includes a first transistor M1_p, a second transistor M2_p, a third transistor M1_n, a fourth transistor M2_n, a fifth transistor M3_p and a sixth transistor M3_n. The readout transistor Msf_n, the selection transistor Msel_n, the reset transistor Mrst_n, and the transfer transistors Mtx_5-Mtx_8 may be N-type transistors respectively.

In the embodiment, a first terminal of the readout transistor Msf_p is coupled to a first circuit node sfd_p of the first stage amplifier 321 (i.e., the first input terminal). A second terminal of the selection transistor Msel_p is coupled to a second circuit node sfs (i.e., the third input terminal) and a first terminal of a bias transistor M0. A control terminal of the readout transistor Msf_p is coupled to a floating diffusion node FD_node_p of the pixel circuit 311 for reading a voltage of the floating diffusion node FD_node_p (i.e., sequentially reading out the sensing results of the pixel units PD1-PD4 in the pixel circuit 311). A first terminal of the reset transistor Mrst_p is coupled to the first circuit node sfd_p (i.e., the first input terminal) of the first stage amplifier 321. A second terminal of the reset transistor Mrst_p is coupled to the floating diffusion node FD_node_p. A control terminal of the reset transistor Mrst_p receives a reset signal RST_1. One terminal of the capacitor Cp1 receives a ramp signal Vramp_up_1, and the other terminal of the capacitor Cp1 is coupled to the floating diffusion node FD_node_p. In the embodiment, the ramp signal Vramp_up_1 may be an up-ramp signal or a down-ramp signal. The pixel units PD1-PD4 may be photodiodes, and are respectively coupled to a reference voltage V1 (such as a ground voltage). Respective first terminals of the transfer transistors Mtx1-Mtx4 are coupled to the floating diffusion node FD_node_p. Respective second terminals of the transfer transistors Mtx1-Mtx4 are respectively coupled to the pixel units PD1-PD4. Respective control terminals of the transfer transistors Mtx1-Mtx4 receive transfer signals TX1-TX4.

In the embodiment, a first terminal of the readout transistor Msf_n is coupled to another first circuit node sfd_n of the first stage amplifier 321 (i.e., the second input terminal). A second terminal of the selection transistor Msel_n is coupled to the second circuit node sfs (i.e., the third input terminal) and the first terminal of the bias transistor M0. A control terminal of the readout transistor Msf_n is coupled to a floating diffusion node FD_node_n of the pixel circuit 312 for reading a voltage of the floating diffusion node FD_node_n (i.e., sequentially reading out the sensing results of the pixel units PD5-PD8 in the pixel circuit 312). A first terminal of the reset transistor Mrst_n is coupled to the other first circuit node sfd_n (i.e., the second input terminal) of the first stage amplifier 321. A second terminal of the reset transistor Mrst_n is coupled to the floating diffusion node FD_node_n. A control terminal of the reset transistor Mrst_n receives a reset signal RST_2. One terminal of the capacitor Cp2 receives a ramp signal Vramp_down_1, and the other terminal of the capacitor Cp2 is coupled to the floating diffusion node FD_node_n. In the embodiment, the ramp signal Vramp_down_1 may be a down-ramp signal or an up-ramp signal. The pixel units PD5-PD8 may be photodiodes, and are respectively coupled to the reference voltage V1 (such as the ground voltage). Respective first terminals of the transfer transistors Mtx5-Mtx8 are coupled to the floating diffusion node FD_node_n. Respective second terminals of the transfer transistors Mtx5-Mtx8 are respectively coupled to the pixel units PD5-PD8. Respective control terminals of the transfer transistors Mtx5-Mtx8 receive transfer signals TX5-TX8. In addition, in the embodiment, the circuit scheme and implementation manner of the first stage amplifier 321 may refer to the description of the above-mentioned embodiment in FIG. 5, which will not be repeated here. In the embodiment, the first stage amplifier 321 may be implemented as a differential amplifier circuit, and may operate according to various signal timings as shown in FIG. 4, so as to effectively read out the sensing results of the pixel units PD1-PD8.

Figure 7:
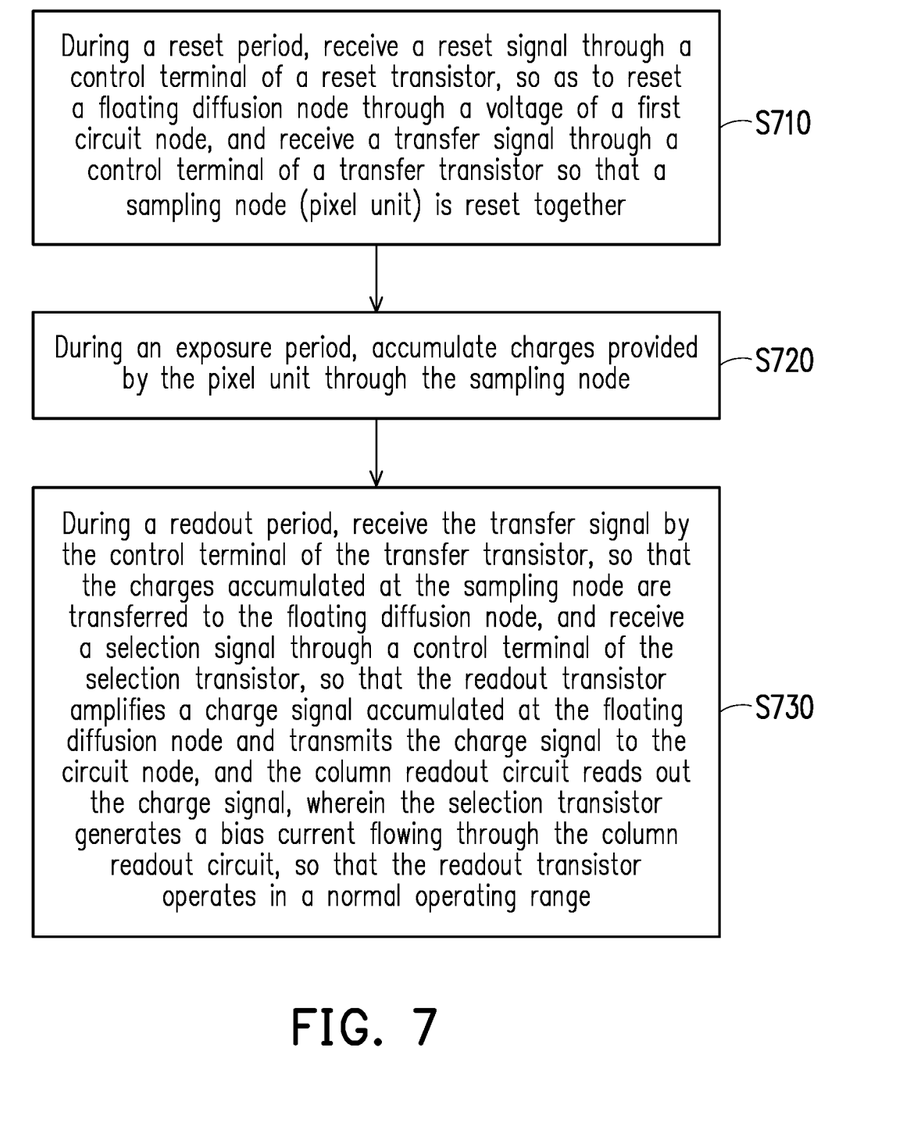
FIG. 7 is a flowchart of an operation method of an image sensor according to an embodiment of the disclosure.

FIG. 7 is a flowchart of an operation method of an image sensor according to an embodiment of the disclosure. Referring to FIG. 1, FIG. 2 and FIG. 7, in the embodiment, the image sensor 100 may be operated according to following steps S710-S730. In step S710, during a reset period from the time t0 to the time t2, the control terminal of the reset transistor Mrst receives the reset signal RST to reset the floating diffusion node FD_node through the voltage of the first circuit node sfd and the control terminal of the transfer transistor Mtx receives the transfer signal TX, so that the sampling node PD_node (the pixel unit PD) is reset together. In step S720, during an exposure period from the time t2 to the time t7, the sampling node PD_node accumulates charges provided by the pixel unit PD. In step S730, during a readout period from the time t7 to the time t10, the control terminal of the transfer transistor Mtx receives the transfer signal TX, so that the charges accumulated at the sampling node PD_node are transferred to the floating diffusion node FD_node, and the control terminal of the selection transistor Msel receives the selection signal SEL, so that the readout transistor Msf amplifies a charge signal accumulated at the floating diffusion node FD_node and transmits it to the first circuit node sfd and the column readout circuit reads out the charge signal, and the second terminal of the selection transistor Msel is coupled to the second circuit node sfs to provide a bias current flowing through the column the readout circuit 120, so that the readout transistor Msf may be in a normal operation range. Therefore, the operation method of the embodiment allows the image sensor 100 to obtain the signal readout path and the reset voltage required by the pixel circuit 110 from the same wire through the first circuit node sfd of the column readout circuit 120.

In summary, in the image sensor and the operation method thereof of the disclosure, a circuit node of the column readout circuit may be used to provide the sensing signal readout path and the reset voltage required by the pixel circuit, so as to effectively reduce a plurality of metal wires (for example, respectively used to provide reset voltages of multiple columns or rows of pixel circuits) in the vertical direction or horizontal direction in the active area. In this way, the image sensor of the disclosure may have a higher fill factor and a good Gb/Gr balance effect. Moreover, since the image sensor of the disclosure may have the higher fill factor, a problem of lens shading fall-off may also be effectively mitigated, and the image sensor of the disclosure may also have better sensing sensitivity. Even, since the image sensor of the disclosure has better sensing sensitivity, the image sensor of the disclosure may achieve better low light signal-to-noise ratio (SNR).

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. An image sensor, comprising:
a first pixel circuit, comprising:
a first pixel unit;
a first transfer transistor, wherein a first terminal of the first transfer transistor is coupled to a first floating diffusion node, and a second terminal of the first transfer transistor is coupled to the first pixel unit;
a first reset transistor, coupled to the first floating diffusion node;
a first readout transistor, wherein a control terminal of the first readout transistor is coupled to the first floating diffusion node; and
a first selection transistor, wherein a first terminal of the first selection transistor is coupled to the first readout transistor; and
a column readout circuit, comprising a first circuit node and a second circuit node,
wherein a first terminal of the first reset transistor and a first terminal of the first readout transistor are coupled to the first circuit node, and a second terminal of the first selection transistor is coupled to the second circuit node,
wherein the column readout circuit further comprises:
a first transistor, wherein a first terminal of the first transistor is coupled to a first operating voltage, and a second terminal of the first transistor is coupled to the first circuit node; and
a second transistor, wherein a first terminal of the second transistor is coupled to the first circuit node, and a second terminal of the second transistor is coupled to a first output terminal.

2. The image sensor according to claim 1, wherein a first terminal of the readout transistor is coupled to the first circuit node, and a second terminal of the readout transistor is coupled to a first terminal of the selection transistor,
wherein the first terminal of the readout transistor is a drain terminal, and the second terminal of the readout transistor is a source terminal.

3. The image sensor according to claim 1, wherein the pixel circuit further comprises:
a first capacitor, coupled between a ramp signal and the floating diffusion node.

4. The image sensor according to claim 3, wherein the ramp signal is an up-ramp signal or a down-ramp signal.

5. The image sensor according to claim 1, wherein the transfer transistor, the reset transistor, the readout transistor, and the selection transistor are respectively N-type transistors.

6. The image sensor according to claim 1, further comprising:
a second pixel circuit, comprising:
a second pixel unit;
a second transfer transistor, wherein a first terminal of the second transfer transistor is coupled to a second floating diffusion node, and a second terminal of the second transfer transistor is coupled to the second pixel unit;
a second reset transistor, coupled to the second floating diffusion node;
a second readout transistor, wherein a control terminal of the second readout transistor is coupled to the second floating diffusion node; and
a second selection transistor, wherein a first terminal of the second selection transistor is coupled to the readout transistor,
wherein the column readout circuit further comprises a third circuit node,
wherein the first terminal of the second transfer transistor and a first terminal of the second readout transistor are coupled to the third circuit node, and a second terminal of the second selection transistor is coupled to the second circuit node.

7. The image sensor according to claim 6, wherein the column readout circuit further comprises:
a third transistor, wherein a first terminal of the third transistor is coupled to the first operating voltage, and a second terminal of the third transistor is coupled to the third circuit node; and a fourth transistor, wherein a first terminal of the fourth transistor is coupled to the third circuit node, and the second terminal of the second transistor is coupled to a second output terminal.

8. The image sensor according to claim 7, wherein a control terminal of the first transistor and a control terminal of the third transistor are coupled to a first control voltage, and a control terminal of the second transistor and a control terminal of the fourth transistor are coupled to a second control voltage.

9. The image sensor according to claim 7, wherein the first transistor, the second transistor, the third transistor, and the fourth transistor are respectively P-type transistors.

10. The image sensor according to claim 6, wherein the first pixel circuit, the second pixel circuit, the first transistor, the second transistor, the third transistor, the fourth transistor, a fifth transistor, a sixth transistor, and a bias transistor form a first stage amplifier.

11. The image sensor according to claim 10, wherein a first input terminal of the first stage amplifier is coupled to the first circuit node, a second input terminal of the first stage amplifier is coupled to the second circuit node, and a third input terminal of the first stage amplifier is coupled to the third circuit node.

12. The image sensor according to claim 6, wherein the column readout circuit further comprises a second stage amplifier, wherein a first input terminal of the second stage amplifier is coupled to a first output terminal of the first stage amplifier, and a second input terminal of the second stage amplifier is coupled to a second output terminal of the first stage amplifier.

13. The image sensor according to claim 12, further comprising a pixel array, wherein a first column of the pixel array comprises a plurality of first pixel circuits and a plurality of second pixel circuits, and the first pixel circuits and the second pixel circuits are arranged in alternation, and the first pixel circuits, the second pixel circuits, the first transistor, the second transistor, the third transistor, the fourth transistor, a fifth transistor, a sixth transistor, and a bias transistor form the first stage amplifier.

14. The image sensor according to claim 12, wherein each column of the pixel array respectively comprises a plurality of first pixel circuits and a plurality of second pixel circuits, and the column readout circuit further comprises a plurality of first transistors, a plurality of second transistors, and a plurality of third transistors, a plurality of fourth transistors, a plurality of fifth transistors, a plurality of sixth transistors, and a plurality of bias transistors, wherein the first pixel circuits, the second pixel circuits, the first transistors, the second transistors, the third transistors, the fourth transistors, the fifth transistors, the sixth transistors, and the bias transistors respectively form a plurality of first stage amplifiers, wherein the first stage amplifiers respectively correspond to a plurality of columns of the pixel array, wherein the column readout circuit further comprises a plurality of second stage amplifiers, and the first stage amplifiers are respectively coupled to the second stage amplifiers.

15. The image sensor according to claim 1, wherein the first pixel circuit further comprises four first pixel units and four first transfer transistors, wherein the four first pixel units are respectively coupled to the first floating diffusion node through the four first transfer transistors.

16. The image sensor according to claim 1, wherein during a reset period, a control terminal of the first reset transistor receives a first reset signal to reset the first floating diffusion node through a first voltage of the first circuit node, and a control terminal of the first transfer transistor receives a first transfer signal so that a first sampling node is reset together, wherein during an exposure period, the first sampling node accumulates charges provided by the first pixel unit, during a readout period, the control terminal of the first transfer transistor receives the first transfer signal, so that the charges accumulated at the first sampling node are transferred to the first floating diffusion node, and a control terminal of the first selection transistor receives a first selection signal, so that the first readout transistor amplifies a charge signal accumulated at the first floating diffusion node and transmits the charge signal to the first circuit node, and the column readout circuit reads out the charge signal, wherein the first selection transistor generates a bias current flowing through the column readout circuit, so that the first readout transistor operates in a normal operating range.

17. An operation method of an image sensor, wherein: the image sensor comprises a first pixel circuit and a column readout circuit, the first pixel circuit comprises a first pixel unit, a first transfer transistor, a first reset transistor, a first readout transistor, and a first selection transistor, the column readout circuit comprises a first circuit node and a second circuit node, wherein a first terminal of the first reset transistor and a first terminal of the first readout transistor are coupled to the first circuit node, and the first selection transistor is coupled to the second circuit node, wherein the column readout circuit further comprises a first transistor and a second transistor, a first terminal of the first transistor is coupled to a first operating voltage, a second terminal of the first transistor is coupled to the first circuit node, a first terminal of the second transistor is coupled to the first circuit node, and a second terminal of the second transistor is coupled to a first output terminal, wherein the operation method comprises:

receiving a first reset signal through a control terminal of the first reset transistor during a reset period to reset a first floating diffusion node through a first voltage of the first circuit node and receiving a first transfer signal through a control terminal of the first transfer transistor so that a first sampling node is reset together;

accumulating charges provided by the first pixel unit through the first sampling node during an exposure period; and receiving the first transfer signal through the control terminal of the first transfer transistor during a readout period, so that the charges accumulated at the first sampling node are transferred to the first floating diffusion node, and receiving a first selection signal through a control terminal of the first selection transistor, so that the first readout transistor amplifies a charge signal accumulated at the first floating diffusion node and transmits the charge signal to the first circuit node, and the column readout circuit reads out the charge signal, wherein the first selection transistor generates a bias current flowing through the column readout circuit, so that the first readout transistor operates in a normal operating range.

* * * * *